United States Patent [19]

Armour

[11] Patent Number: 5,729,737
[45] Date of Patent: Mar. 17, 1998

[54] SELECTIVE DATA COMPRESSION SYSTEM

[76] Inventor: William M. Armour, 112 Clinton St., Youngstown, Ohio 44506

[21] Appl. No.: 502,135

[22] Filed: Jul. 13, 1995

[51] Int. Cl.⁶ .................................................. G06F 17/30
[52] U.S. Cl. .................................... 395/612; 395/611
[58] Field of Search .............................. 395/601, 611, 395/612, 613, 614, 615; 341/73, 79; 128/702; 364/413.06

[56] References Cited

U.S. PATENT DOCUMENTS

| | | | |
|---|---|---|---|
| 4,558,302 | 12/1985 | Welch | 235/310 |
| 4,730,348 | 3/1988 | MacCrisken | 375/122 |
| 5,051,745 | 9/1991 | Katz | 341/51 |
| 5,333,313 | 7/1994 | Heising | 395/600 |
| 5,398,183 | 3/1995 | Elliott | 128/702 |
| 5,412,384 | 5/1995 | Chang et al. | 341/79 |
| 5,534,861 | 7/1996 | Chang et al. | 341/79 |
| 5,546,575 | 8/1996 | Potter et al. | 395/600 |

*Primary Examiner*—Thomas G. Black
*Assistant Examiner*—Buay Lian Ho
*Attorney, Agent, or Firm*—Harpman & Harpman

[57] ABSTRACT

A method of compressing data by relating incoming data to information stored in a set of inter-related encoding tables. In operation, selective data stream elements are encoded by a simple substitution table which replaces a given block of incoming data with variables from a pre-selected character set. The resulting encoded characters are grouped to form strings, the length and variable type correspond to strings stored in one of the plurality of encoding tables the value of the variables in one table relating to variables in another such that each element in one set is in some way related to at least one element in another. When a matching string is found within the secondary encoding tables, the string name of the matching string is read and stored. Groups of string names are stored and new strings are then formed and compared with pre-existing strings found in the related encoding as proper tables in a sequential repeating fashion as new input data is received. The path of the data through the encoding tables is stored in an indexing file for decompression.

6 Claims, 5 Drawing Sheets

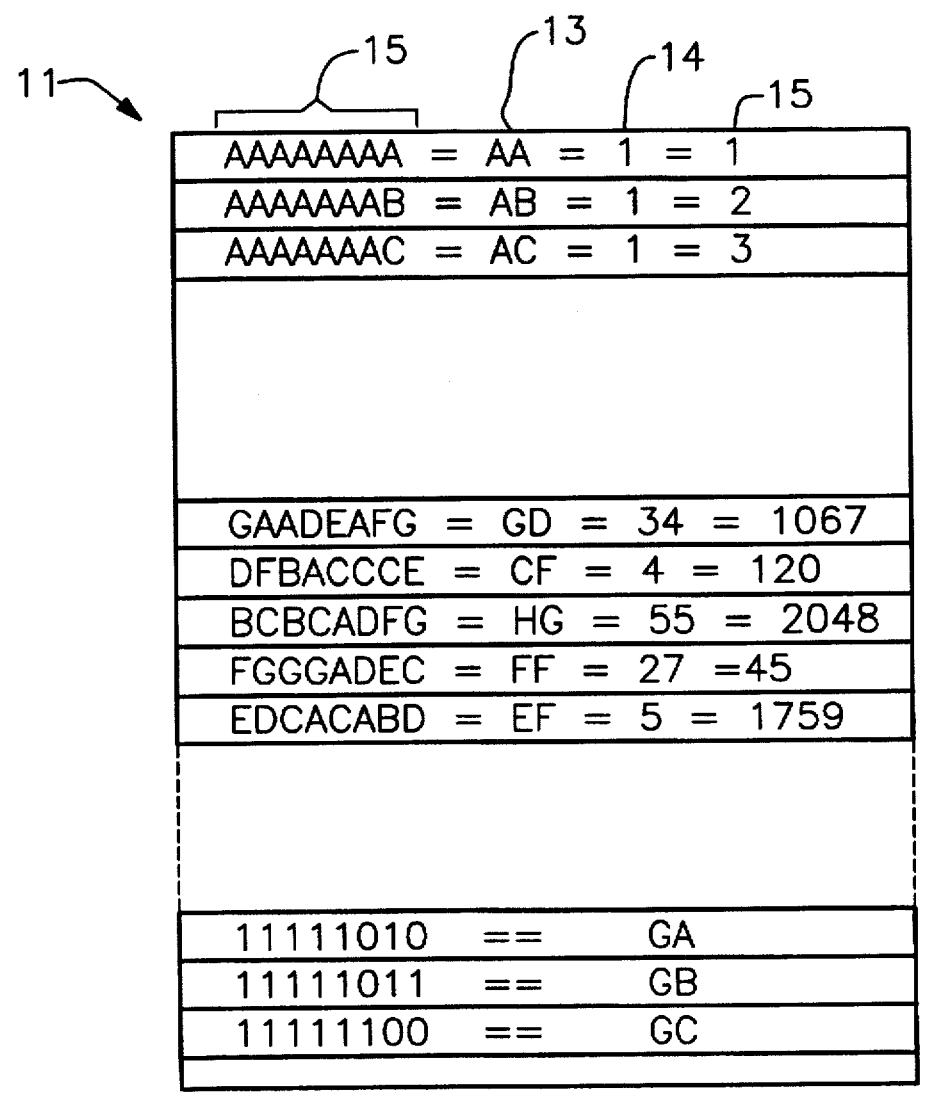

| AAAAAAAA | = | AA | = | 1 | = | 1 |
|---|---|---|---|---|---|---|
| AAAAAAAB | = | AB | = | 1 | = | 2 |
| AAAAAAAC | = | AC | = | 1 | = | 3 |
| GAADEAFG | = | GD | = | 34 | = | 1067 |
| DFBACCCE | = | CF | = | 4 | = | 120 |
| BCBCADFG | = | HG | = | 55 | = | 2048 |
| FGGGADEC | = | FF | = | 27 | = | 45 |
| EDCACABD | = | EF | = | 5 | = | 1759 |
| 11111010 | == | GA | | | | |
| 11111011 | == | GB | | | | |
| 11111100 | == | GC | | | | |

*Fig. 4*

SELECTIVE DATA COMPRESSION SYSTEM

BACKGROUND OF THE INVENTION

Prior art systems are known that incode a stream of digital data into compressed digital data and back into original data signals. Both for purposes of reducing the amount of space required for storage and reducing the amount of time and expenditure involved in transmitting this data over phone lines. Most systems in use today are based partially or entirely on the "Huffman Variable-Bit-Length Encoding". Where the size of the characters representing the data is varied based on the likelihood of its use. To better understand, a close examination of output of any stream of data would reveal uneven usage among the characters comprising the data. For instance, an examination of a typical English paragraph which show that the letter "E" is more likely to occur in a sentence than the letters "X" or "Z". A variable bit system would assign a shorter code to represent the more frequently used character.

The concept behind another method in use stores incoming data initially, then as redundancies appear in the data stream, new information is recorded as reference to information stored previously.

Although the systems in use based on the information outlined above are effective, and are continually advanced and improved, this invention overcomes several shortcomings inherent in their design. Such as significant loss of compression rate if the pattern of incoming data is unexpected or changes suddenly. For maximum compression a new usage table would have to be generated to handle the differences in data encountered when compressing more than one type of data. By encoding of the binary information directly and using a compression technique that differs from those described this method improves on the prior art by increasing flexibility and compression rates.

Also above described systems lack a set compression rate making it difficult for the user to determine his need for storage space or transmission time, or if indeed the results of compression storage and eventual decompression are worthy of the effort.

It is the method of this invention to improve on prior art by the data encoding itself being more modified repeatedly during the compression process. It is possible to adjust these modifications so that a given level of compression can be reasonably obtained for data of any size.

This invention is directed towards a method that provides a much higher compression rate than hereinbefore possible.

DESCRIPTION OF PRIOR ART

Prior art systems are known that incode a stream of digital data into compressed digital data and decode the compressed digital data back into the original data signals. It is the goal of data compression to reduce the space required to store information with the ability to quickly and easily retrieve any desired piece of information so stored. See for example U.S. Pat. Nos. 5,051,745, 4,730,348 and 4,558,302.

In U.S. Pat. No. 5,051,745 a string search and compression system is disclosed wherein string searching and compression is achieved by string indexing via a hashing function and origination by hashing values of the string elements incoded.

U.S. Pat. No. 4,730,348 is an adaptive data compression system for increasing the speed of data transmission over a communication channel using two data compression units by incoding tables.

Finally, in U.S. Pat. No. 4,558,302 a high speed data compression and decompression apparatus and method is illustrated wherein the input stream of data is compressed by storing in a string table strings of data character signals. Each stored string comprises a prefix string and an extension character where same is last character in the string.

OBJECTS AND ADVANTAGES

Accordingly, it is an object of the present invention to disclose a system and method to compress and store input data by multiple step compression of data strings by encoding through a plurality of related substitution tables. The data strings are formed from conversion of input data by means of a substitution table which assigns a pre-determined value for a given variable. The encoded strings representing the original information are to be compared for a match to the string substitution table contained within the secondary set of inter-related encoding tables henceforth the secondary group of tables will be referred to as the program's main database.

It is the further object of this invention that when a match is found the string name or other associated value defining the string is stored and the process is repeated sequentially to form a set of variables which individually represent the original data. This set of variables are grouped to form new strings and compared again to the main database. When a match is found the associated value of the new string now representing the totality of the encoded data is stored, this process is repeated sequentially the results assembled in the above described manner and again compared to the main database. Obviously, for this system to function as described it would require an array of substituting and encoding tables of unreasonable size and complexity. To overcome this, the resultant information from a string match is formatted in such a fashion as to be factorable into at least one of the available encoding tables. The main database is comprised of a group of string variables, their combination and names based on these combinations. Additionally, each line of variables is equated to a set of values that sequentially form a table or tables allowing additional information to be encoded and compressed either by directly forming a table or by association with an existing tables, string or string name. The central component of the main string base is the string substitution table, a collection of data strings used for compression, which is based on a single string which the number of variables to be used is known and set at a constant length, from this all possible combination of strings are calculated to be used for reference.

It is the further object of the invention that the characters comprising the string name used to define each of the string combinations must be limited to the variables that comprise the strings. These variables can be used significantly, singlely or in combination, the representing characters must be of a length that is smaller than the string it represents. It would, of course, be impossible for this group of variables to completely represent the totality of string combinations being limited exclusively to the number of variables embodied in the primary string, string name variables would be repeated as necessary. Additional tables can be formed based on any quantifiable element occurring in a given table and equated to series of consecutive variables.

Obviously, a wide assortment of related tables can be formed based on the above criteria for purpose of this example two additional tables based on simple numerical data were created. The first a positioning table affixes a separate numerical value for each string, originating with one and a second table assigns a separate numerical value also being with one each time a string name is reused.

Thus far the above described method has referred to encoding and substitution tables comprising the central portion of the system as separate file areas where presumably pointers would be assigned to elements of one table indicating the location of relevant segments in another encoding table. The preferred method integrates all data contained each table of the main data base to a single table. Each element from a given encoding table is combined with all related data by conclusively linking the variables to form contiguous variable string. A string searching or hashing routine can access the values for each individual table by reading the string from various start to end points, providing all characters in each table is given a fixed length and position so that start and end points common to all can be determined.

SUMMARY OF THE INVENTION

A system and method to compress and store input data by multiple step compression of data strings. The data strings are formed from conversion of input data into string name variables that define variable strings from a conversion table within the main database which is formed of a pre-select group of variables presented in all possible combinations. Dual compression of input data strings provides a recoding and indexing of compression variables by positioning the reoccurring value of the variable within the main database used for compression.

DESCRIPTION OF THE DRAWINGS

FIG. 4 is an illustration of the main database; and

DESCRIPTION OF THE PREFERRED EMBODIMENT

Figure 1:
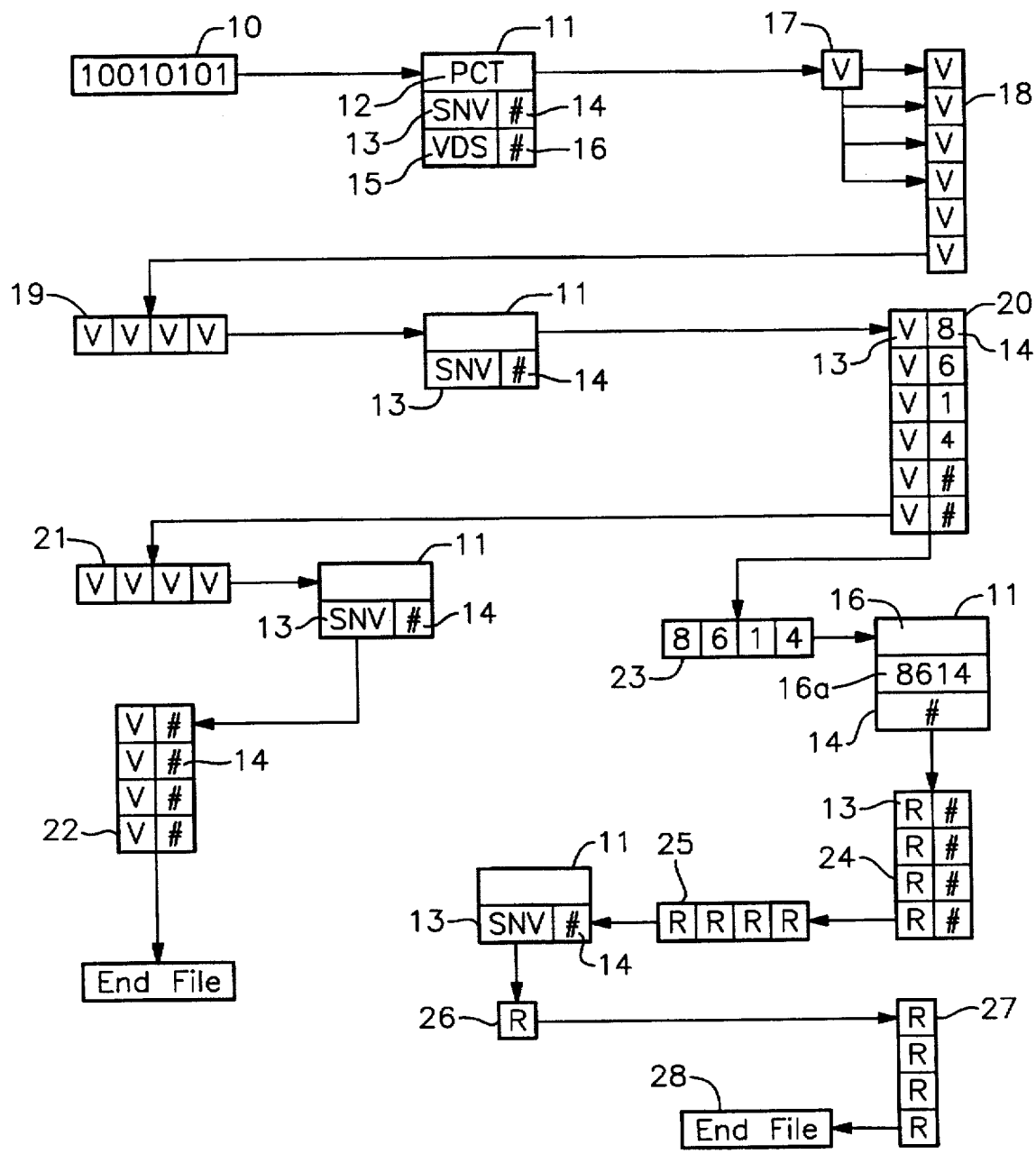
FIG. 1 is an illustration of a system flow compression chart indicating flow path characteristics of data and compression data through the system.
Figure 2:
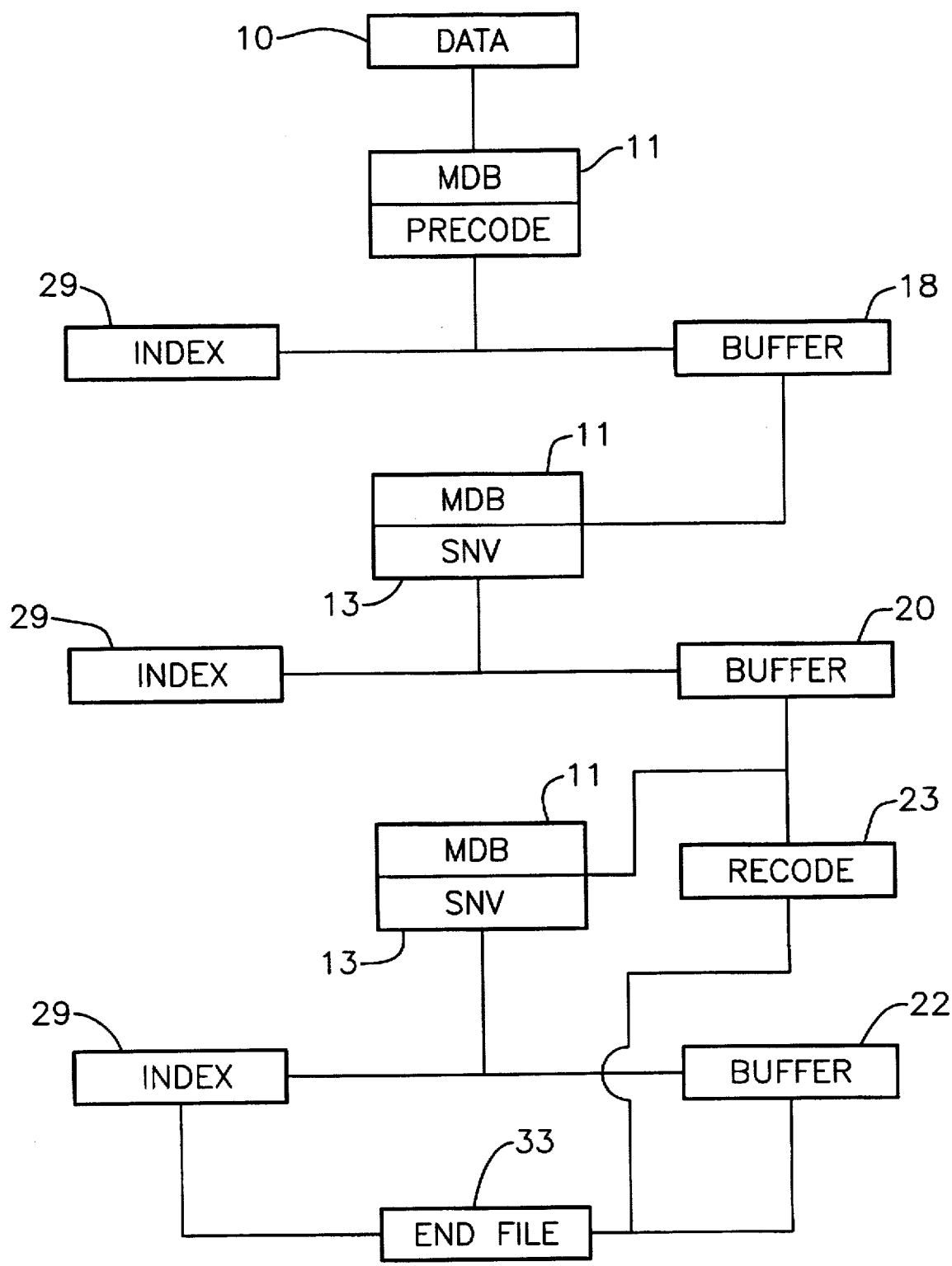
FIG. 2 is a summary program flow chart of compression data.

Referring to FIG. 1 of the drawings, there is shown a data compression system defining original input binary data 10, a main database 11 including a substitution precoding table (PCT) 12 as well as string name variables (SNV) 13 within the main database having occurrence numbers 14 and variable data strings (VDS) 15 with position numbers 16, all within the same main database 11.

Referring to FIGS. 1 & 4 of the drawings, the main database 11 is initially formed from a single string of variables of a pre-determined length to be used as a base string and every possible combination of variables of this base string showing the construction and relationship of variable strings and their relating tables. The (PCT) 12 contained in the main database 11 is illustrated wherein binary data 10 is associated with preselected variables. The string name variables (SNV) 13 are out of necessity required to repeat themselves within the main database 11 given the finite number of variables available from the original (VDS) 15. Each time an (SNV) 13 representing a (VDS) 15 is repeated, it is assigned the occurrence number 14 determined from the specific times that the (SNV) has been repeated within the main database, an example of same would be (SNV) AB with an occurrence number 15 or alternately AB with an occurrence number of 27.

In operation, the original binary data 10 is assigned substitution variables (V) 17 from the precoding table 12 of the main database 11 which are then complied in a first contiguous sequence storage buffer 18 to form original variable strings 19 of predetermined length equal to that of the original (VDS) 15. The original variable string 19 which has been formed from the substitution precoding table 12 of the main database 11 then begins its initial compression defined as compression level I as illustrated in FIG. 1 of the drawings.

The original variable string 19 is first compared with the (VDS) 15 in main database 11 to determine its string name variable 13 and its associated re-occurrence number 14 which has been pre-assigned to it as hereinbefore discussed.

The string name variable 13 representing its (VDS) 15 now representing the original variable string 19 is placed in a temporary storage buffer 20. As groups of original binary data 10 are incoded as described forming original variable strings 19, the process is repeated so as to fill the temporary storage buffer 20 sequentially with string name variables 13 and occurrence numbers 14 representing the original variable strings 19 of the incoded data.

Once the buffer 20 has been filled with the selected (SNV) 13 they are then retrieved as compressed variable strings of a given length which then become a secondary new original variable string 21.

The new original variable string 21 representing the summation of selected (SNV's) 13 in the storage buffer 20 are then compared again with the main database 11 for further compression by selection of representative (SNV) 13 and occurrence numbers 14 which in turn are stored in a secondary storage buffer at 22.

The above referred to process is repeated sequentially generating a stream of original variable strings 19, new original variable strings 21 and finally a fully compressed variable string at 22.

After the first level of compression is achieved a recoded compression step begins that uses the string occurrence numbers 14 from the short term storage buffer 20 to form strings of occurrence numbers at 23, in this example 8614 and compares it with the position number 16 in the main database in which all possible variations of the original variable string 19 have been predetermined and have been assigned a number of positions depending on their respective sequential position within the main database 11. As hereinbefore described, a matching corresponding position number 16A (example 8614) of a string length is matched within the main database 11 and its respective string name variable 13 (R) is then stored in a short term storage buffer 24 forming again a string name variable string at 25 (R). The (SNVS) 25 is then is compared with the main database 11 to determine a new (SNV) 26 which represents all the recoded data heretofore.

The final new (SNV) 26 (R) of the recoded compression is added to a storage buffer 27 which determines a string length to achieve the recoded string of variables 28 end file.

The compression of the original variable string 19 with the co-compression and indexing by the recoding after the first level of compression provides a method by which decompression can occur to determine (back through multiple steps) which variable refers to which variable string at which level to achieve full decompression of the compressed data.

Figure 5:
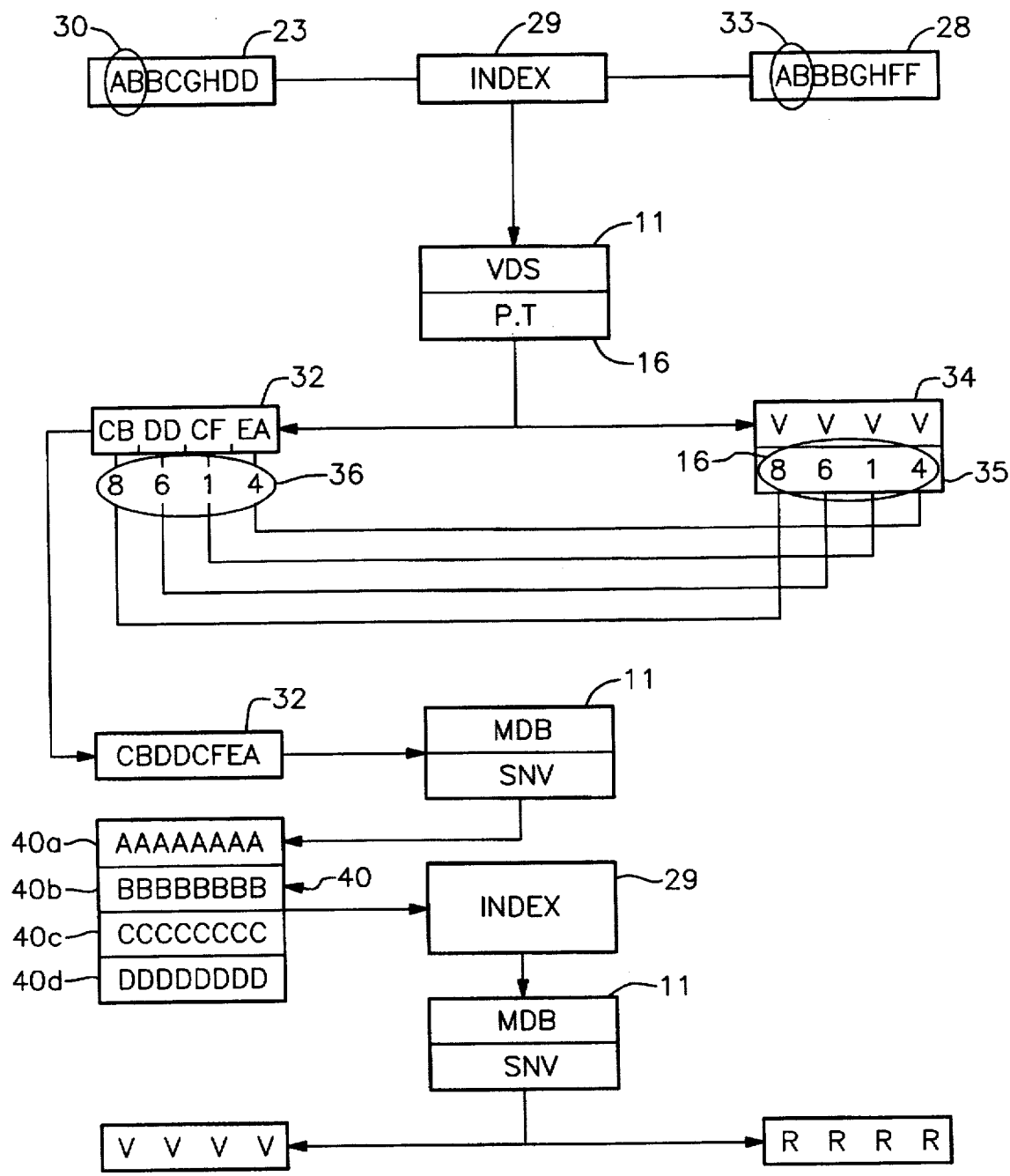
FIG. 5 is an illustration of a system flow chart illustrating decompression of final compressed data and recoded data and indexed material.

Referring now to FIG. 5 of the drawings, the decompression of a fully compressed string of variables 23 is presented with its recorded string of variables 28 and supplemental index file 29.

To achieve decompression, a first variable 30 (example AB) of the fully compressed string of variables 23 is compared with the main database 11 and position number 16 determining its corresponding representative variable string 32. To determine the decompression occurrence value of the variables within the variable string 32, the first variable 33 (example AB) of the fully recoded variable string 28 is compared with the main database 11 and position number 16 to determine its representative variable (V) data string 34 and its position 35 within the main database.

The corresponding string position 35 is then applied sequentially to the variable string 32 as seen at 36 in which in this example chosen for illustration the string position number of the recoded variable string is 8614 so that the 8 is then applied to the first variable at 36 which thus determines the compressed variable's strings 32 decompressed status as being the variable's eighth occurrence.

This process is repeated sequentially in this example with the second number 6 of the string position at 35 being applied to the second variable in the variable string 32 and so on so that the final compressed variable string 32 can be identified as the first variable's eighth position, the second variables 6 occurrence, the third variable's first occurrence and the fourth variable's fourth occurrence, thus applying and achieving a decompression of the variable string.

Using this method, the recoded variable will not necessarily contain sufficient information to restore a complete line of incoded data. Specifically if the recoded character (the number 8 referred to in FIG. 5 of the drawings at 36) representing the occurrence of the named variable ("CB") shown in FIG. 5 of the drawings represented as 32 had been the number 28 if might have referred to characters not anticipated by the system. Recalling the recoded sequence, the number 8 represents the eighth occurrence of the character (CB) and the name variable associated with the eighth location of the positioning table 16. In decompression, the name variable can then be referred back to its location in the positioning table 16 thereby indicating a specific name variable. Although the number and location of the variables that are recoded will change at each level it will occur in a simple repeating pattern and should be easily managed. In the process of recoding, a situation wherein for a given block of incoded variables, the occurring numbers for the assembled string names having been grouped and compared to the positioning number in the main database, there will be situations in which the occurring numbers when assembled will refer to position numbers that are outside the range of the main database positioning table. To compensate for errors of this type, the maximum number of string name variables to be grouped must be determined based on the length of the main data string and the number of variables used. The data not read is stored and grouped with the next set of variable strings. The original data string is not altered by the recoded process and once the compiled occurring numbers have been matched with the positioning number from the main database the string name for this set is recorded in the same fashion as other variables.

Figure 3:
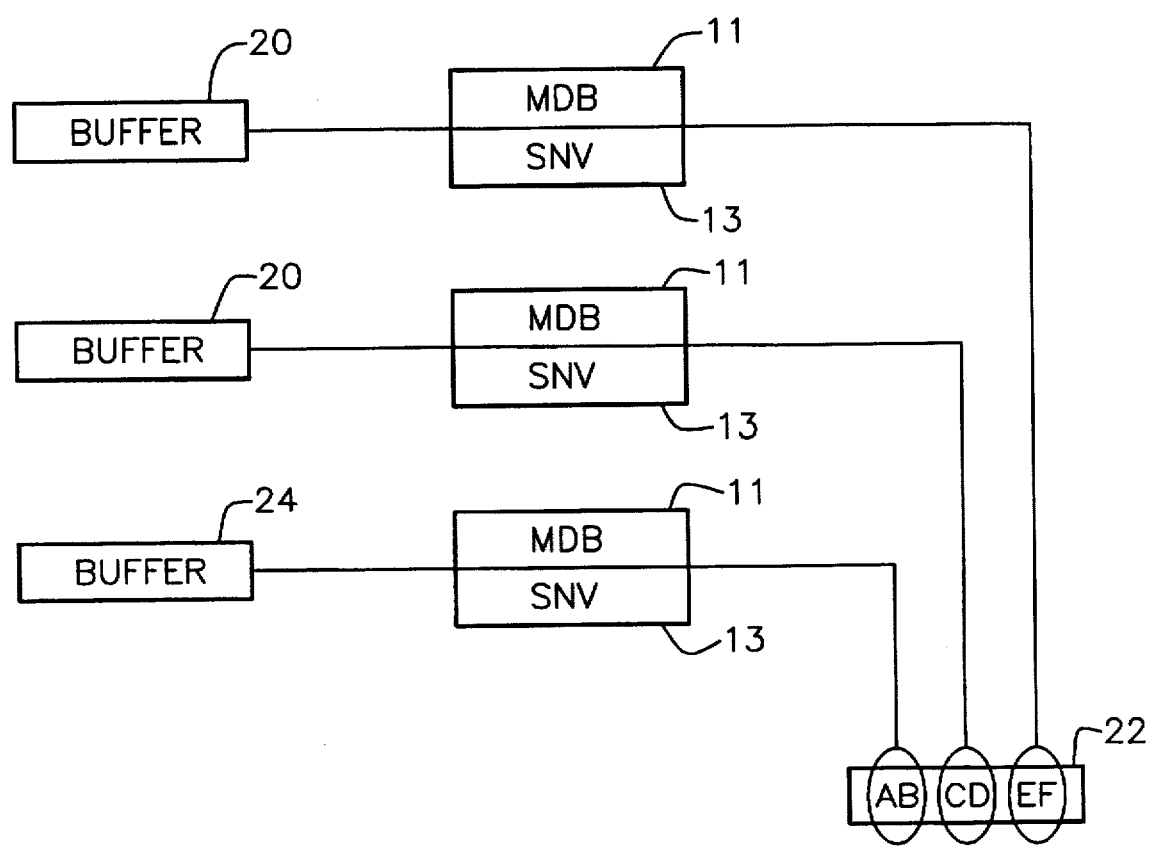
FIG. 3 is a illustration of a system flow compression chart indicating variable strings and recoding variable buffers interleaved into strings.

Referring to FIG. 3 of the drawings a variable interleaving process is illustrated to reduce the need for storage space. In this application compressed buffers 20 and recoded buffers 24 are selectively compared to the main database 11 to produce representative SNV's 13 which are then stored in a secondary storage buffer 22 as illustrated by examples SNV AB, CD etc.

Referring back to FIG. 5 of the drawings, the variables 23 containing compression data are compared to the main database and stored in a new buffer. The data from this or subsequent buffers can be replaced into the original buffer and compressed as new variable. Referring to the recoded information (R), the variable interlacing process can be observed as the new string occurrence numbers are compiled into string names as described and stored in separate buffers 40. This data is handled in the same manner as the previous buffer's data with the exception being the result of the next compression level, both compressions recording data being stored as string variables in the same area which could eventually be returned to the original storage area.

This can further be illustrated wherein the decompressed variable string 32 is then compared to the main database 11, its string disassembled into the appropriate string names 40 A,B,C,D and those string names back into SNV 41 and receded SNV 42. Using an interlacing system as described at least one of the strings generated from the decompressing strings would contain some or all of the recoding information required for the remaining strings. Careful indexing is necessary to identify the significance of each variable. An indexing utility assigning each level of compression a consecutive value and each value variable position in a string a consecutive value would permit any variable anywhere in compression to be located by these coordinates.

Based on the description of the method given and examples illustrating same, it can be seen that a number of similar systems can be derived from the concepts contained in this text. Therefore it is stated that a system could be created with greater speed and efficiency and still be keeping with the method described herein.

Thus it will be seen that a new and useful data compression system has been illustrated and described and it will occur to those skilled in the art that various changes and modifications may be made therein without departing from the spirit of the invention.

Therefore I claim:

1. A database compression and decompression system for data storage comprising; encoding a binary data stream into a selective substitution variable from a precoded table, assembling said substitution variables into original variable strings, storage means for storing said original variable strings, comparing said original variable strings with said data string to a plurality of related tables in a main database, and determining an associated name variable and name variable position therefrom, assembling said string name variables into new original variable data strings, means for sequential compression of the new original variable data string with said related tables in said main database to achieve compression of said binary data stream, said plurality of related tables in said main database comprising; precoding tables in multiple combinations of single string of said selective variables, said string of variables of a predetermined length and occurrence number and position number, means for recording said original variable string by said occurrence number and means for decompression of said binary data.

2. The database compression system of claim 1 wherein said storage means comprises memory means having plurality of locations.

3. The database compression system of claim 1 wherein said means for sequential comparison comprises; repeating said comparison and selection of string name variables with said associating tables in said main database, determining occurrence and position numbers and storing said selected string name variables in memory buffers.

4. The database compression system of claim 1 wherein said means for recoding said original variable strings comprises, selecting said string occurrence numbers from a new original variable string, comparing said occurrence numbers in occurrence number strings with the position number from said original number strings, defining a recoding string name variable for said position numbers, forming a recoding string name variable, comparing said recoding string name variable with said main database.

5. The database compression system of claim 1 wherein means for decompression comprises; comparing said compressed string variable, said recorded string variable and a index file with said plurality of tables in said main database, determining decompression occurrence value of said respective variable string variables and determining said position number, applying said string position number sequentially to said variable string in multiple repetitive sequence.

6. The data compression system of claim 1 wherein said plurality of related tables include; a data string table comprised of all possible combinations of a selected group of variables, uniform in length and arranged sequentially, where each value can be referred to by and is equal to values contained in associated tables, wherein said data is referred to by string name variables derived from and restricted to a select group of variables, wherein occurrence numbers are formed based on the repetition of selected values, and wherein position numbers are assigned sequentially to each value contained within said tables.

* * * * *